United States Patent [19]

Schonstedt

[11] 4,110,689
[45] Aug. 29, 1978

[54] MAGNETIC DETECTING APPARATUS WITH NOVEL MEANS FOR POSITIONING SENSOR ASSEMBLY IN A HOUSING

[75] Inventor: Erick O. Schonstedt, Reston, Va.

[73] Assignee: Schonstedt Instrument Company, Reston, Va.

[21] Appl. No.: 757,124

[22] Filed: Jan. 4, 1977

Related U.S. Application Data

[60] Continuation of Ser. No. 542,084, Jan. 17, 1975, abandoned, which is a division of Ser. No. 303,598, Nov. 3, 1972, Pat. No. 3,894,283.

[51] Int. Cl.² ............................................. G01R 33/04
[52] U.S. Cl. ......................................... 324/254; 324/3
[58] Field of Search ...................... 324/43 R, 47, 41, 3

[56] References Cited

U.S. PATENT DOCUMENTS

| | | | |
|---|---|---|---|
| 2,642,479 | 6/1953 | Jones | 324/43 G |
| 3,439,264 | 4/1969 | Schonstedt | 324/43 R |
| 3,736,502 | 5/1973 | Schonstedt | 324/43 R |

OTHER PUBLICATIONS

Product Engineering; Jan. 13, 1965; p. 64.

*Primary Examiner*—Robert J. Corcoran
*Attorney, Agent, or Firm*—Shapiro and Shapiro

[57] ABSTRACT

A magnetic locator in which flux-gate sensors are mounted in longitudinal notches at the ends of a tubular support to form an assembly which is inserted into a tubular housing, the sensors being press-fitted into the notches and the tubular support being provided with spaced bushings of material which is compressed when inserted into the housing. A stiff hairpin excitation conductor extends through the sensors and through the tubular support, being preassembled with one of the sensors and being connected to a circuit chassis for positioning the sensor assembly in the housing. A simplified electrical circuit is employed which produces a beat frequency signal when a magnetic object is located and which avoids the need for a voltage to frequency converter.

4 Claims, 8 Drawing Figures

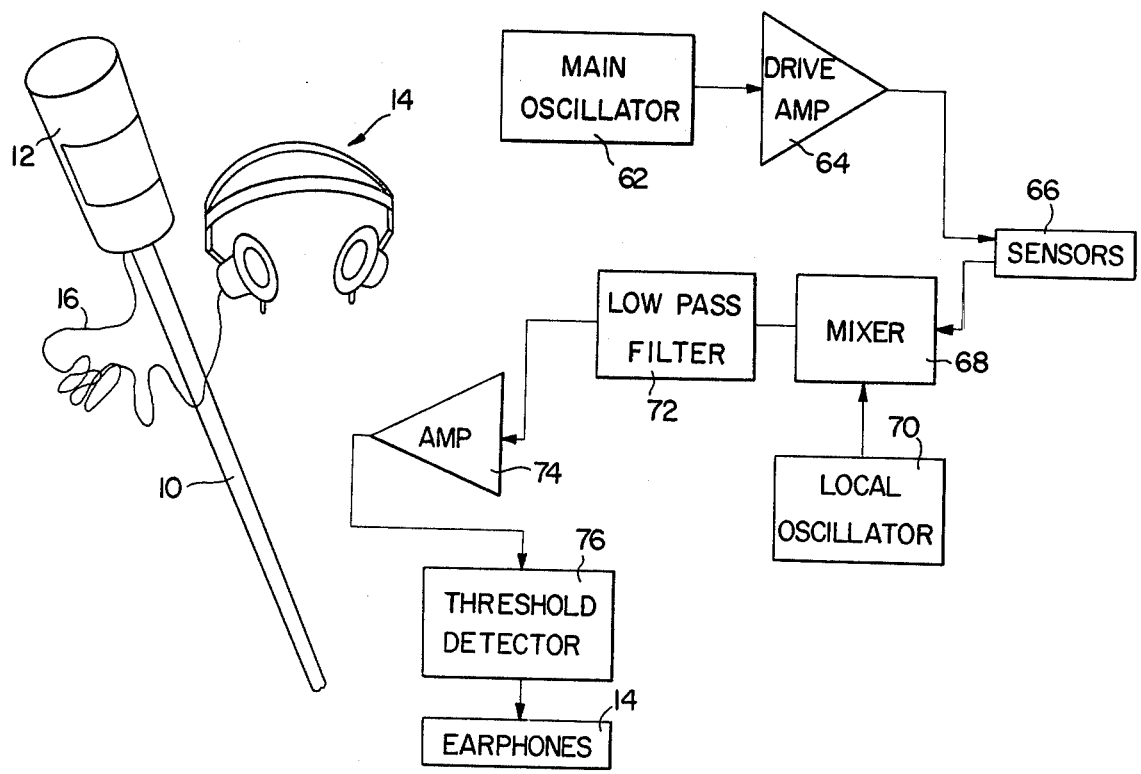
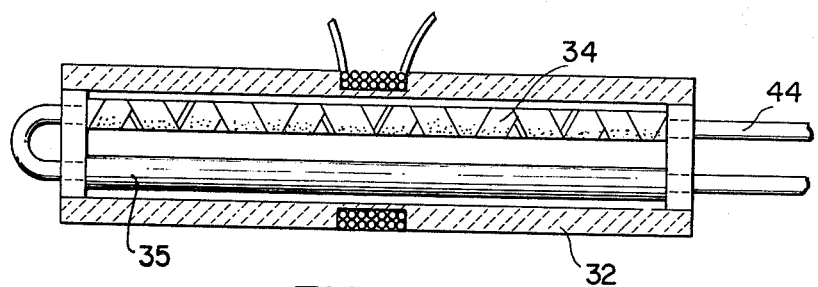
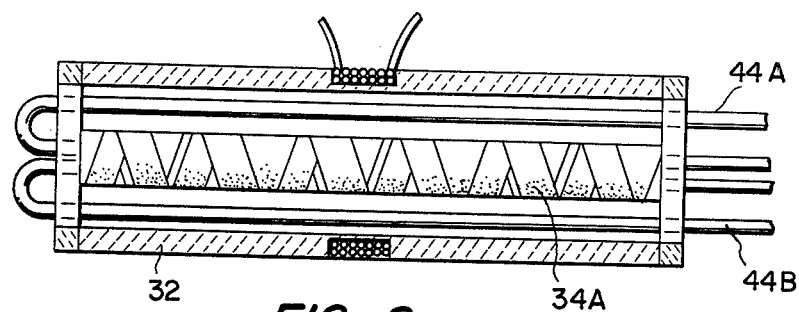

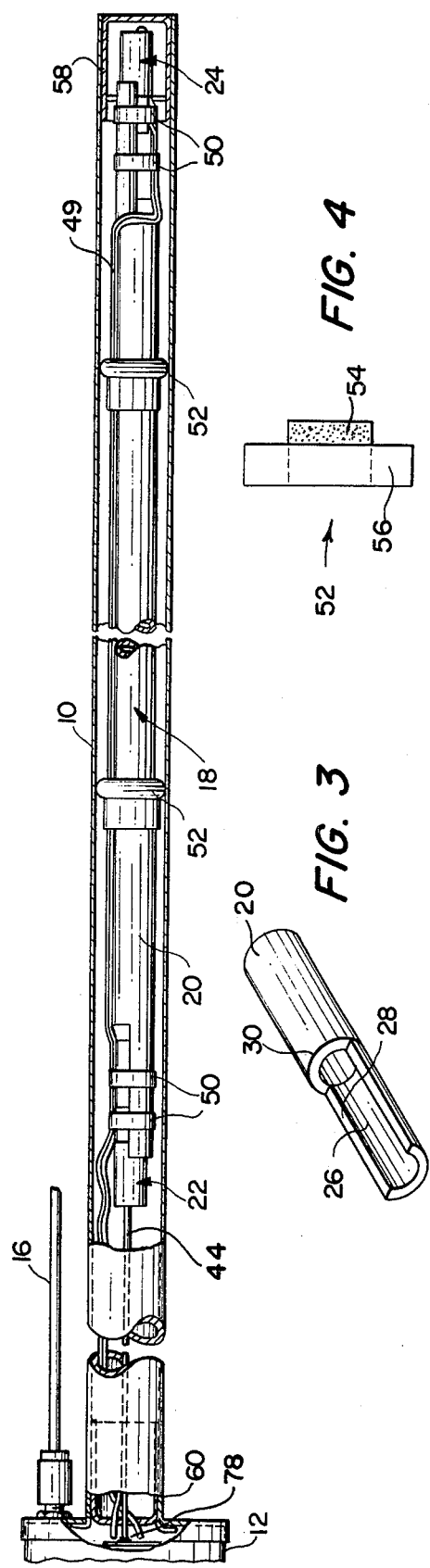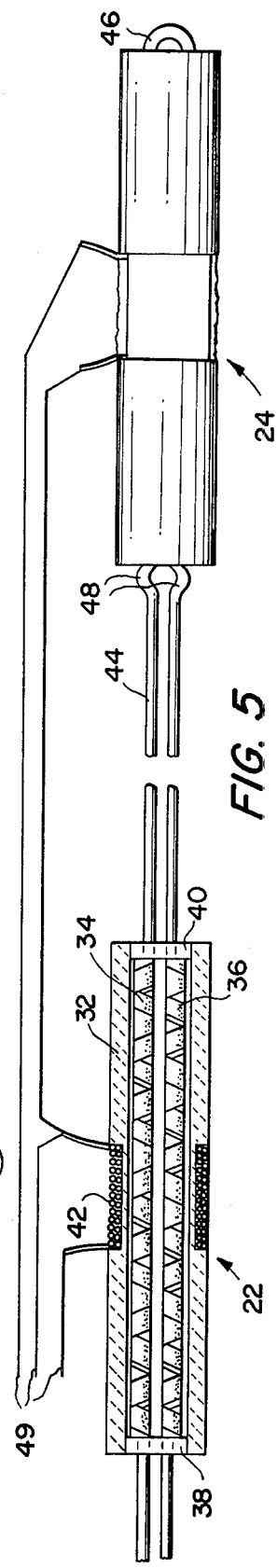

MAGNETIC DETECTING APPARATUS WITH NOVEL MEANS FOR POSITIONING SENSOR ASSEMBLY IN A HOUSING

This is a continuation application of Ser. No. 542,084, filed Jan. 17, 1975, now abandoned, which is a division of Ser. No. 303,598, filed Nov. 3, 1972, now U.S. Pat. No. 3,894,283 granted July 8, 1975.

BACKGROUND OF THE INVENTION

This invention relates to apparatus for detecting magnetic phenomena and is more particularly concerned with a magnetic locator and a method of manufacturing the same.

Devices for locating magnetic objects and/or for detecting or measuring magnetic fields are well known. Such devices may comprise a plurality of magnetic sensor units, including appropriate windings or coils, which are spaced apart and mounted within a non-magnetic tubular housing. See, for example, U.S. Pat. Nos. 3,281,660; 2,642,479; 2,620,381; and 3,064,185. The applicant himself has disclosed such devices and various types of sensors which may be used therein. See, for example, U.S. Pat. Nos. 3,050,679; 3,487,459; 3,488,579; 2,916,696; 2,981,885; 3,168,696; 3,076,930; 3,426,269; and 3,439,264. In general, prior magnetic detecting apparatus employing a pair of spaced magnetic sensors in a tubular housing has suffered from one or more of the following deficiencies: complexity, high cost, poor sensitivity. Prior electrical circuits for use in magnetic locators, such as those disclosed in patents cited above, or those disclosed in U.S. Pat. Nos. 3,274,488; 3,461,387; 3,355,658, tend to be unduly complex and expensive. A prior art magnetic locator sold commercially by the applicant's assignee is indicative of the complexity and expense of prior devices. In that locator the sensor cores are individually wound with multiple turns of thin excitation wire and placed in a tube upon which signal windings are wound. This assembly is placed in another tube which is attached to the end of a further tube. The circuit includes synchronous detectors and a voltage to frequency converter.

SUMMARY OF THE INVENTION

It is accordingly a principal object of the present invention to provide improved apparatus for detecting magnetic phenomena and especially for locating magnetic objects.

A further object of the invention is to provide magnetic locator apparatus with greater sensitivity than comparable locator apparatus, such as dip needle apparatus, and which is easier and faster to operate.

A further object of the invention is to provide magnetic locator apparatus which is unaffected by motion or orientation, which is light weight and easily held in the hand, and which has a smooth elongated probe configuration to permit the apparatus to be poked into shrubbery, brush, snowbanks, and other areas that cannot be reached with other locators.

Another object of the invention is to provide improved subassemblies for magnetic locator apparatus or the like.

Still another object of the invention is to provide simplified methods of assembling the components of magnetic locator apparatus or the like.

A still further object of the invention is to provide an improved circuit for magnetic locator apparatus or the like.

Briefly stated, the present invention comprises an elongated tubular housing which contains a pair of spaced magnetic sensor units. The sensor units are supported in longitudinal notches formed at opposite ends of a tubular support. A stiff hairpin excitation wire extends through the sensor units and through the tubular support, one sensor unit being preassembled with the excitation wire, and the other being assembled with the excitation wire after the first sensor unit and the excitation wire are mounted upon the tubular support. The assembly comprising the sensor units and the tubular support is provided with spaced bushings, composed of foam material which is compressed when the assembly is inserted into the tubular housing. The excitation wire is connected to a circuit chassis to position the sensor assembly in the housing. The sensors are preferably of the flux-gate type, producing an output signal at twice the frequency of the excitation oscillations when a magnetic object is detected. This signal is mixed with the output of a local oscillator to produce a beat frequency which is passed through a threshold detector to earphones.

BRIEF DESCRIPTION OF THE DRAWINGS

The invention will be further described in conjunction with the accompanying drawings, which illustrate preferred and exemplary embodiments, and wherein:

FIG. 1 is a perspective view showing the external configuration of the apparatus;

FIG. 2 is a longitudinal sectional view showing the internal arrangement, and particularly the manner in which the magnetic sensors are mounted;

FIG. 3 is a fragmentary perspective view showing one end of the tubular support for the sensors;

FIG. 4 is a plan view illustrating a bushing subassembly;

FIG. 5 is a side elevation view, partly in section, illustrating the manner in which the sensor units are assembled with the excitation conductor;

FIG. 6 is a block diagram of a circuit employed in the invention; and

FIGS. 7 and 8 are longitudinal sectional views of modified sensor units.

DETAILED DESCRIPTION OF THE INVENTION

Referring to the drawings, and initially to FIG. 1 thereof, the external configuration of the apparatus of the invention resembles a broomstick with a can at one end thereof. The "broomstick" is actually a one-piece elongated tubular housing 10, with a smooth exterior, and the "can" is a tubular housing 12 of larger diameter fixed to one end of housing 10. Earphones 14 are connected by a cable 16 to a circuit within the housing 12. Since the apparatus of the invention is light weight, the user may readily support the apparatus by grasping the top of housing 10, just below housing 12, and may sweep the free lower end of housing 10 along the ground in a search for hidden magnetic objects. Object detection will be signalled in the earphones 14, as will appear more fully hereinafter. Housing 10 may be a continuous tube of aluminum between three and four feet in length. The external configuration resembles that shown in the aforesaid U.S. Pat. No. 3,281,660, but the elongated housing 10 is a single tube with a completely smooth exterior.

FIG. 2 illustrates the interior of housing 10, which contains an assembly 18 comprising a tubular support 20, magnetic sensor units 22 and 24 and other parts which will be described hereinafter. The tubular support 20 is an elongated non-magnetic pipe, preferably of circular cross-section, and may be an aluminum tube about 22 inches long with an outer diameter of ⅝ inch and an I.D. of 0.5 inch. To provide receptacles for the mounting of the magnetic sensors, each end of the tube is cut away to form a longitudinal notch, such as the notch 26 shown in FIG. 3, the notch being approximately semi-circular in cross section. The notch may be two inches long, for example, and the longitudinal edges 28 may be positioned about ¼ inch below an extension of the side 30 of the pipe. The notch at one end of the tubular support 20 preferably faces one side thereof, and the notch at the other end preferably faces the opposite side. This tends to produce equal and opposite stresses in the support material and thus tends to maintain parallelism, more particularly collinearity, of the magnetic axes of the sensor units, which is necessary for accurate results.

The sensor units are shown in greater detail in FIG. 5. Each unit may comprise an insulating tubular housing 32 containing one or more elongated magnetic cores, such as the cores 34 and 36, which may be formed by winding Permalloy strips about a ceramic tube, as taught by several of the applicant's prior patents, for example. The cores are supported between insulating end discs 38 and 40 received within opposite ends of the housing 32. The housing is provided with a central circumferential groove in which a signal winding 42 is wound circumferentially. An excitation conductor is constituted by a rather stiff wire 44, such as No. 14 magnet wire.

It is preferred to preassemble one of the sensor units or bobbins, such as unit 24, with the excitation conductor 44. To accomplish this the excitation conductor is bent to form a U-shape or hairpin configuration, and the legs of the conductor are inserted through corresponding cores in sensor unit 24 (appropriate holes being provided in the end discs). The bight 46 of the excitation conductor engages one end disc of sensor unit 24. Adjacent to the exterior of the other end disc the excitation conductor is preferably bent or crimped as indicated at 48 to stabilize the position of the sensor unit on the excitation conductor.

Although both sensor units are shown assembled with the excitation conductor in FIG. 5, as noted above it is preferred to preassemble one of the units with the excitation conductor. Then the preassembled sensor unit and excitation conductor are mounted upon the tubular support 20 by inserting the free ends of the excitation conductor into the tubular support and then pressing the sensor unit laterally into an associated notch at the end of the tubular support. The dimensions of the notch and the sensor are related so that the sensor is snapped into the notch and held snugly therein by the frictional embrace of the notch.

The excitation conductor 44 is long enough to protrude well beyond the opposite end of the tubular support 20. The protruding free ends of the excitation conductor are then inserted into the other sensor unit, such as 22, and this sensor unit is then moved to its proper position relative to the tubular support 20 and is press-fitted into the corresponding notch in the same manner as sensor 24. Lead wires 49 are then soldered to the signal windings 42, as indicated in FIG. 5, passing along the exterior of the tubular support 20 as shown in FIG. 2. Electrical tape 50 may be wound about the sensor units and the signal leads where desired.

Before the assembly 18 is inserted into the tubular housing 10, bushings 52 are provided upon the assembly at spaced locations for supporting the assembly within the tubular housing. Each bushing is preferably formed as shown in FIG. 4 by providing a strip of flat foam material, such as polyurethane 54, with a strip of adhesive tape 56 overlapping one end thereof, and by wrapping the foam material around the exterior of the tubular support and securing it thereto by means of the tape. The foam bushing thus produced is large enough in diameter so as to be compressed and distorted when inserted into the housing 10. The bushings resist longitudinal movement of assembly 18 within the housing, particularly in a direction reverse to the initial insertion direction. After insertion of the assembly 18 in the housing, the open end of the housing may be closed by a tubular cap 58 held in the housing by an interference fit. At the opposite end of the housing 10 a tubular cap 60 may also be inserted, suitable apertures being provided therein for passage of the excitation and signal conductors, by which these conductors may be extended to the electronics within the housing 12.

Before the circuit is described, reference is made to FIGS. 7 and 8, which illustrate modifications of the sensors. In FIG. 7 one of the tubular cores has been replaced by a plain insulating tube 35. This "unbalanced" configuration is not as desirable, however, as a balanced configuration, such as that shown in FIG. 5, which has the virtue that misalignment of one of the cores tends to be countered by an opposite misalignment of the other core if the sensor is twisted. Also, the unbalanced configuration tends to be noisier.

In FIG. 8 two hairpin excitation conductors 44A and 44B are employed, each having one leg passing through a single core 34A and one leg passing along the exterior of the core. The return paths outside the core should be symmetrical to reduce noise. The excitation conductors may be connected in parallel, for example.

Referring to FIG. 5 again, it will be noted that the signal lead wires 49 are connected with the signal windings 42 so as to provide a differential output. Such an arrangement is shown, for example, in the applicant's prior U.S. Pat. No. 3,488,579, referred to above. Excitation oscillations at an appropriate frequency (e.g., 10 KHz) are provided by a main oscillator 62, as shown in FIG. 6, and after suitable amplification by an amplifier 64 are applied to the hairpin excitation conductors of the sensors, the sensors and the associated conductors being shown diagrammatically by the block 66. The differential output is applied to a mixer 68, which is also connected to a local oscillator 70. As is well known in the art, the signal frequency from the sensors when a magnetic object is detected will be twice the frequency from the main oscillator 62. This double frequency signal is mixed with the oscillations from local oscillator 70, having a frequency (e.g., 21 KHz) different from the signal frequency, so as to produce a beat frequency output at an audible frequency, such as 1,000 Hz. The beat frequency is selected by a low pass filter 72 and after amplification by an amplifier 74 is applied to the earphones 14 (electrical-to-acoustic transducer) through a threshold detector 76, which sets a noise rejection level. The amplitude of the beat frequency signal heard in the earphones 14 will vary with the proximity of the free end of housing 10 (closed by cap 58) to a magnetic object to be located.

The invention provides a highly sensitive, yet simple and economical, magnetic locator. The components of the invention are easily assembled, and complex fasteners and supports are not required to mount the sensors and hold them in proper position. Assembly 18 is positioned merely by the simple bushings 52 and by soldering the ends of the stiff excitation conductor 44 to a printed circuit board attached to a chassis fixed within housing 12, as indicated diagrammatically by reference character 78 in FIG. 2.

While preferred embodiments of the invention have been shown and described, it will be apparent to those skilled in the art that changes can be made in these embodiments without departing from the principles and spirit of the invention, the scope of which is defined in the appended claims.

The invention claimed is:

1. Magnetic detecting apparatus comprising housing means having a first portion containing a circuit chassis fixed therein and having an elongated tubular portion extending from said first portion, a sensor assembly in said tubular portion and including an elongated tubular support extending along said tubular portion and first and second magnetic sensor units, each sensor unit including a tubular housing with first and second end discs and a hollow magnetic core extending between the first and second end discs of the sensor unit, said elongated tubular support having a notch extending longitudinally at each end of the support and open laterally of the support, each sensor unit being fitted into a corresponding notch with its tubular housing and its core extending longitudinally of the support and being fixed to the support, and a stiff excitation conductor extending from said first portion of said housing means successively through the first end disc, the core, and the second end disc of the first sensor unit and the first end disc, the core, and the second end disc of the second sensor unit, and then back to said first portion of said housing means, said stiff excitation conductor being fixed to said sensor assembly by a first bend in said conductor externally adjacent to a first end disc of a sensor unit and a second bend in said conductor externally adjacent to a second end disc of a sensor unit, the position of said sensor assembly in said tubular portion of said housing means being fixed by positioning means between said assembly and said tubular portion and by connection of said stiff excitation conductor to said chassis.

2. Magnetic detecting apparatus in accordance with claim 1, wherein said first bend is externally adjacent to the first end disc of the second sensor unit and wherein said excitation conductor has a hairpin configuration and said second bend comprises the bight of said excitation conductor externally adjacent to the second end disc of the second sensor unit.

3. Magnetic detecting apparatus in accordance with claim 2, wherein said excitation conductor extends freely through the first sensor unit without bends adjacent to the ends of that unit.

4. Magnetic detecting apparatus in accordance with claim 3, wherein said positioning means comprises bushings which are compressed and distorted by said tubular portion of said housing means and which resist longitudinal movement of said sensor assembly in said housing means.

* * * * *